(12) United States Patent
Schilloff et al.

(10) Patent No.: US 6,498,708 B2
(45) Date of Patent: *Dec. 24, 2002

(54) METHOD AND APPARATUS FOR MOUNTING PRINTED CIRCUIT BOARD COMPONENTS

(75) Inventors: Walter Schilloff, Endicott, NY (US); Scot Bigelow, Binghamton, NY (US); Glenn Wilson, Endicott, NY (US); Bryan Cole, Nichols, NY (US)

(73) Assignee: Emerson Electric Co., St. Louis, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,324

(22) Filed: May 27, 1999

(65) Prior Publication Data

US 2002/0001161 A1 Jan. 3, 2002

(51) Int. Cl.$^7$ ................................................ H02H 9/00
(52) U.S. Cl. .......................... 361/58; 361/719; 361/720; 174/255
(58) Field of Search .................... 361/58, 760, 761, 361/777, 743, 719, 720, 748; 174/260, 262, 263, 52.4, 250, 255, 261, 264, 265, 266, 267

(56) References Cited

U.S. PATENT DOCUMENTS

| | | | | |
|---|---|---|---|---|
| 5,130,881 A | * | 7/1992 | Hilland | 174/52.4 |
| 5,341,088 A | | 8/1994 | Davis | 324/106 |
| 5,448,452 A | * | 9/1995 | Kondo et al. | 361/760 |
| 5,453,580 A | | 9/1995 | Franke et al. | 174/250 |
| 5,504,370 A | | 4/1996 | Lin et al. | 257/676 |
| 5,523,921 A | | 6/1996 | Van Lydegraf | 361/818 |
| 5,608,262 A | * | 3/1997 | Degani et al. | 257/723 |
| 5,666,040 A | | 9/1997 | Bourbeau | 320/6 |
| 5,699,231 A | * | 12/1997 | ElHatem et al. | 174/260 |
| 5,870,284 A | | 2/1999 | Stewart et al. | 361/699 |
| 6,067,231 A | * | 5/2000 | Lu | 361/704 |
| 6,154,371 A | * | 11/2000 | Oba et al. | 361/761 |

FOREIGN PATENT DOCUMENTS

| | | | | |
|---|---|---|---|---|
| JP | 02-298094 | * | 10/1990 | H05K/1/18 |
| JP | 06-244525 | * | 9/1994 | |
| JP | 09-069196 | * | 3/1997 | |
| JP | 09-148690 | * | 6/1997 | |
| JP | 10-056241 | * | 2/1998 | |
| JP | 11-54854 | * | 2/1999 | |
| JP | 2000-012985 | * | 1/2000 | |
| JP | 2000-223617 | * | 8/2000 | |

* cited by examiner

*Primary Examiner*—Brian Sircus
*Assistant Examiner*—Roberto J. Rios
(74) *Attorney, Agent, or Firm*—Howrey Simon Arnold & White, LLP

(57) ABSTRACT

A method and apparatus for mounting heat generating components on a printed circuit board. Components mounted on the printed circuit board that generate heat may alter the properties of the printed circuit board and allow the printed circuit board to conduct current. To stop the flow of current in the printed circuit board, a slot may be used between the mounting points of the component. The slot prevents current from flowing within the printed circuit board.

26 Claims, 7 Drawing Sheets

METHOD AND APPARATUS FOR MOUNTING PRINTED CIRCUIT BOARD COMPONENTS

BACKGROUND OF THE INVENTION

1. Field of the Invention

This application relates to a method and apparatus for mounting components on a printed circuit board. More particularly, it relates to the use of slots, holes, or cutouts to prevent current from conducting through a printed circuit board when it is heated to a high temperature by a component.

2. General Background

Printed circuit boards are used in a variety of electronic products for interconnecting electronic components and for providing a mounting structure to hold electronic components in place. Printed circuit boards are made from many different materials. The laminate for printed circuit boards are typically produced using phenolic or epoxy resins. Reinforcing materials may include cotton paper, woven glass, mat glass, and glass veil. A popular combination of epoxy resin and glass reinforcement is referred to as FR-4. Other popular combinations of resins and reinforcement are classified by commonly known notations such as FR-2, CEM-1, CEM-3, FR-5 and GI. Common materials used for printed circuit boards are described in Printed Circuits Handbook, third edition by Clyde F. Coombs, Jr. (1988). Most of the base materials for printed circuit boards, however, are designed to operate no more than 85° C. to 150° C. Some laminates are designed for higher temperatures but are made of ceramics. The disadvantage of ceramic substrates is that they are considerably more expensive than printed circuit boards made of epoxy or phenolic resins.

Electrical components may be assembled on printed circuit boards in a variety of ways. The two main assembly types are through-hole and surface mount. Through-hole components are mounted to the printed circuit boards via connector wire leads or pins, also referred to as mounting legs. Surface mounted components, on the other hand, do not have through-hole wire leads or pins. Surface mounted components are usually mounted to the surface of the printed circuit board by soldering methods such as wave soldering or reflow soldering.

A problem may arise when a component generates heat. This may happen when a component fails or is subjected to an abnormal condition such as an over-voltage condition which may arise during a lifted neutral failure or other event. The heat may conduct down the mounting legs of a through-hole component or down the soldered contacts of a surface mounted component. Heat generated by the component may also dissipate and radiate to the surface of the printed circuit board. If the surface temperature of the printed circuit board is allowed to reach a high temperature, the printed circuit board's properties begin to change and free electrons allow current to flow between the mounting points of a component.

A component that may generate heat under certain conditions is a Metal Oxide Varistor ("MOV"). MOVs may be commercially purchased in several different packages. A common and inexpensive type of MOV is a through-hole component. However, MOVs may also be obtained as a surface mounted component.

MOVs are used in surge suppression and are typically put directly across a line voltage. If the MOV fails, the MOV may generate heat. MOVs may also generate heat when put across a line voltage in series with a fuse. If a fuse is used, the fuse must be large enough to handle thousands of amperes of fast pulsed current to obtain necessary ratings. When a fuse link is large enough to handle the high short-duration pulsed current, there exists a continuous current somewhere between 2.5 amperes and 25 amperes where the fuse will not open. If a MOV is "protected" by such a fuse and the lower current continuously flows into the MOV, current flows through the MOV and voltage is present across the MOV. This current and voltage at the same time causes a tremendous amount of energy to be released as heat.

As described above, heat dissipating or radiating from a component (such as an MOV) may cause problems if it is allowed to heat the printed circuit board. Accordingly, there is a need for a method and apparatus for mounting components on a printed circuit board to minimize the effects of components that generate heat. The present invention uses slots, holes, or cutout areas to overcome, or at least reduce the effects of, the problems set forth above.

Slots, holes, or cutout areas of printed circuit boards have long been used in the industry for several different reasons. However, they have not been used to solve the problems described above. One use of slots, holes or cutout areas is for physical mounting of through-hole components on printed circuit boards. The lead wires or pins of the components are inserted into the slots, holes or cutouts of the printed circuit board for retention and contact.

Another use of slots, holes, or cutouts is for controlling the natural resonance frequency of a portion of a printed circuit board. This is described in U.S. Pat. No. 5,453,580 to Franke et al. This patent discloses the use of slots, holes or other openings around vibration sensitive circuitry.

Other uses of slots, holes, or cutouts is for voltage isolation such as in the area of horizontal output transistors in monitors and televisions or to help in the isolation of line to load parts of an electronic circuit. Slots, holes, or cutouts may also be used to allow sand, fluid, light or other media to flow from one side to another side. Another use is to cool power resistors via convection.

SUMMARY OF THE INVENTION

In accordance with the present invention, a slot, hole or cutout is provided in a printed circuit board between the mounting points of a component. The slot, hole or cutout is sized to prevent the printed circuit board from conducting current after the surface is heated by the mounted component. Further, the slot, hole or cutout is inexpensive and easy to prepare.

In one embodiment of the invention, a printed circuit board assembly comprises of a mounting board having a top surface and a bottom surface. The mounting board has at least two mounting points for receiving an electrical component. The mounting board has a slot between the two mounting points wherein the slot extends from the top surface of the mounting board to the bottom surface of the mounting board. The slot prevents current from passing through the mounting board between each of the mounting points. For a through-hole component, the mounting points are the through-holes of the mounting board where the mounting legs of the component are inserted and soldered. For a surface mounted component, the mounting points are the soldered contacts. The width and length of the slot is sufficiently wide and long to prevent current from passing through the printed circuit board. The slot may have a variety of geometric shapes including circular or square ends or may be rectangular or elliptical in shape.

In another embodiment, a printed circuit board assembly comprises of a mounting board having a top and bottom surface as well as at least two holes for receiving an electrical component. The electrical component has at least two mounting legs and the mounting legs are inserted into the two holes of the mounting board. The mounting board also has a slot between the two holes of the mounting board and extends from the top surface to the bottom surface of the mounting board. The slot prevents current from passing between each of the two holes of the mounting board. The slot is sufficiently wide and long to prevent current from passing through the printed circuit board and the slot may have a variety of geometric shapes including circular or square ends or may be rectangular or elliptical in shape.

In still another embodiment, a printed circuit board assembly comprises of a mounting board and an electrical component that radiates heat to the top surface of the mounting board. The printed board assembly includes a means for attaching the electrical component to the mounting board at least two mounting points. There is also a means for preventing current from passing through the mounting board between each of the mounting points.

In a further embodiment, there is an apparatus for preventing current from passing through a printed circuit board comprising of a circuit board and a heat generating component. The heat generating component has two mounting legs that are attached to the circuit board. The circuit board has a slot between the two mounting legs of the heat generating component.

In yet another embodiment, a printed circuit board assembly includes a mounting board for mounting a plurality of electrical components. The plurality of electrical components includes a heat generating component having at least two mounting legs which are attached to the mounting board. There is an inlet trace and an outlet trace connected to the mounting legs to provide electrical current to the heat generating component. The mounting board has a slot between the two mounting legs and the slot prevents current from passing through the mounting board between the mounting legs of the heat generating component.

In another embodiment, the invention is a method of preventing current in a printed circuit board by machining a slot in the printed circuit board and mounting a component to the top surface of the printed circuit board at least two mounting points. The slot is positioned between the mounting points.

Although the present description uses a MOV as an example electrical component, the present invention is not limited to the mounting of MOVs. The present invention would work for any component that may generate heat sufficient to change the properties of the printed circuit board and to allow current to pass between the mounting points of a component.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

Figure 1:
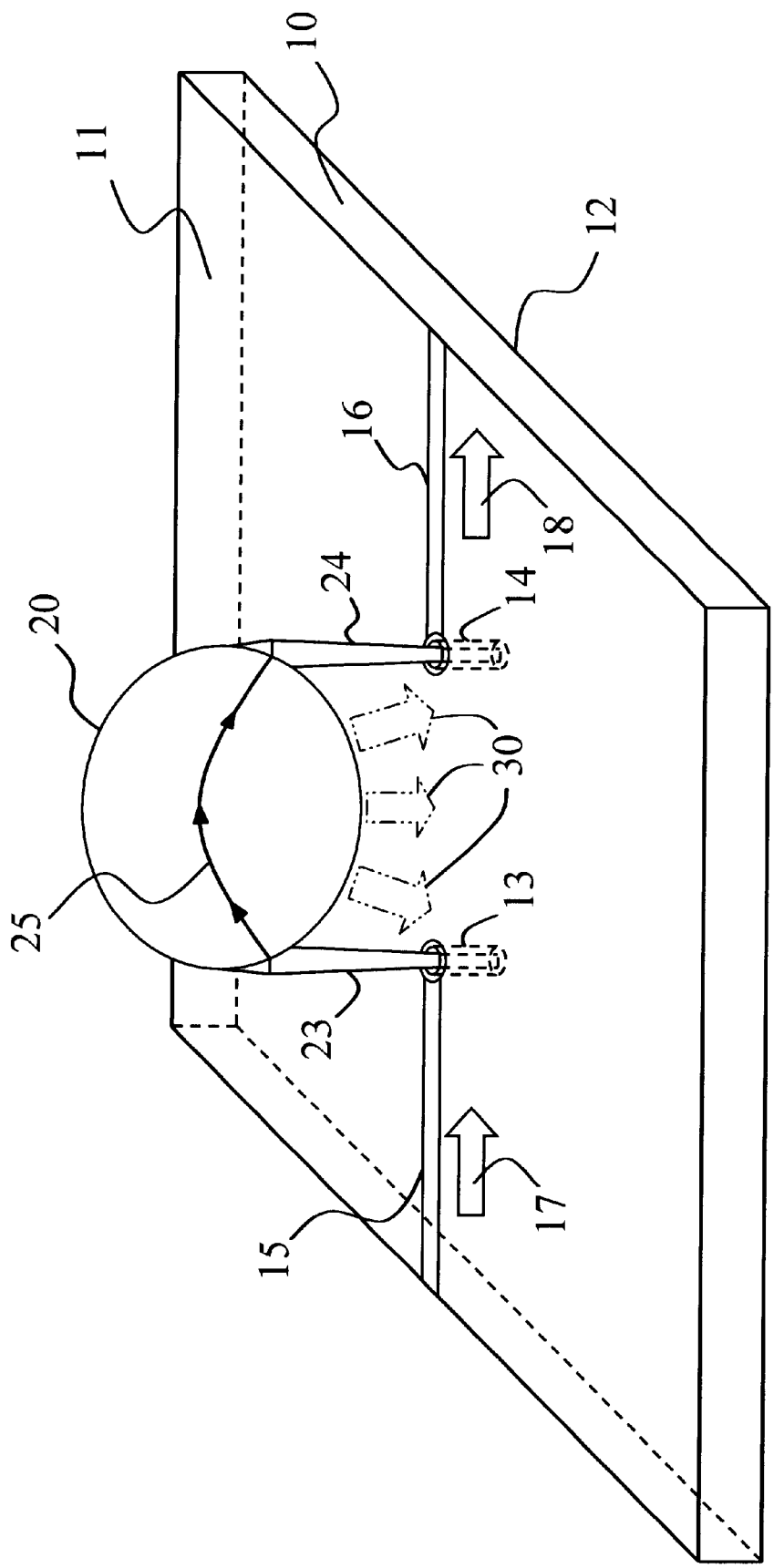
FIG. 1 is a perspective view of an electrical component dissipating or radiating heat to the printed circuit board.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DESCRIPTION OF ILLUSTRATIVE EMBODIMENTS

The present invention is directed to overcoming the problems resulting from a component generating heat that dissipates or radiates to the surface of the printed circuit board. As the heat is allowed to raise the temperature of the printed circuit board, the printed circuit board's properties change. If the printed circuit board reaches a high temperature, current may begin to flow between the mounting points of a component.

Figure 2:
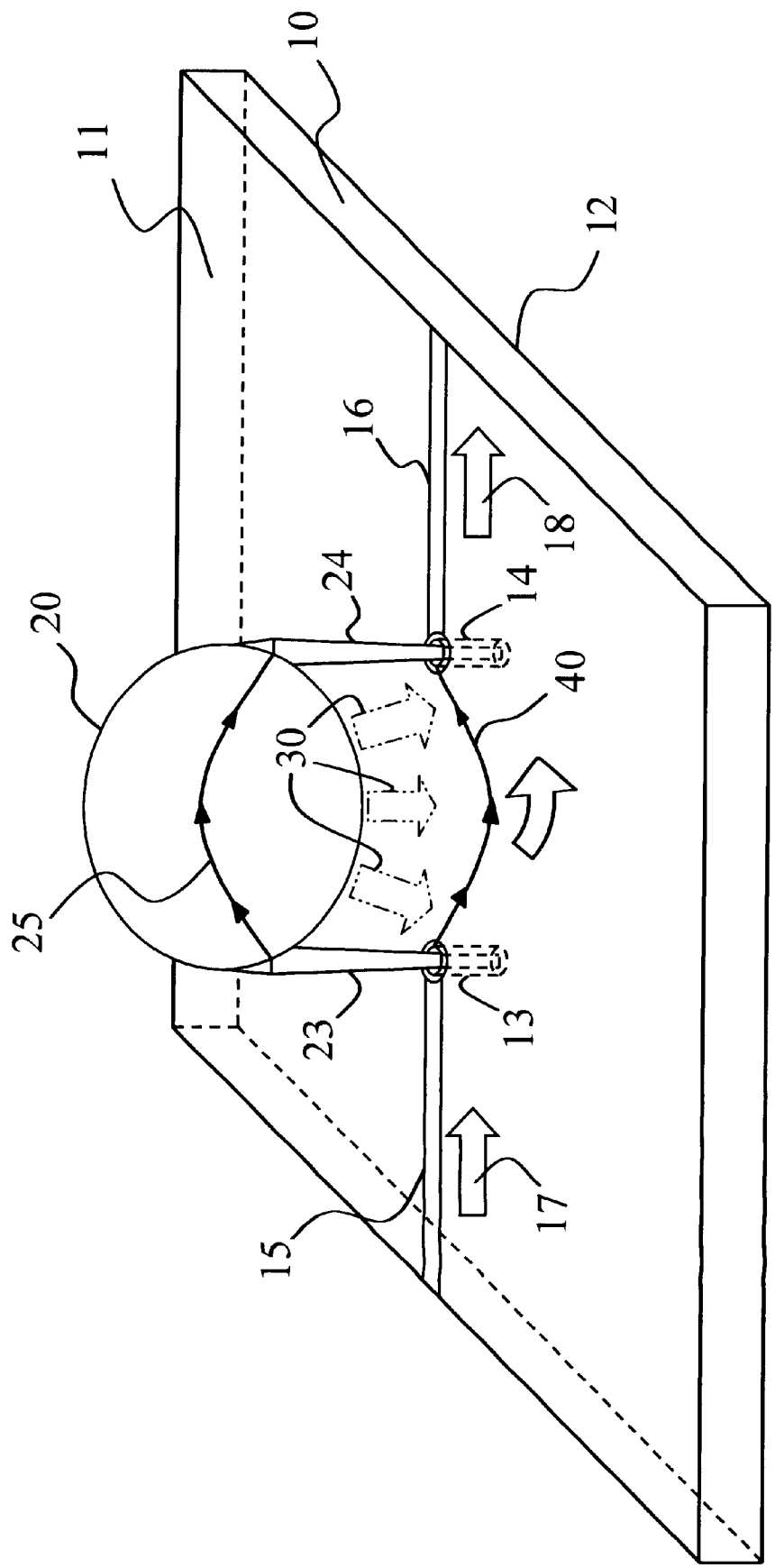
FIGS. 2 and 3 are perspective views of different stages where the printed circuit board is conducting current as a result of the heat dissipating or radiating from the electrical component.
Figure 3:
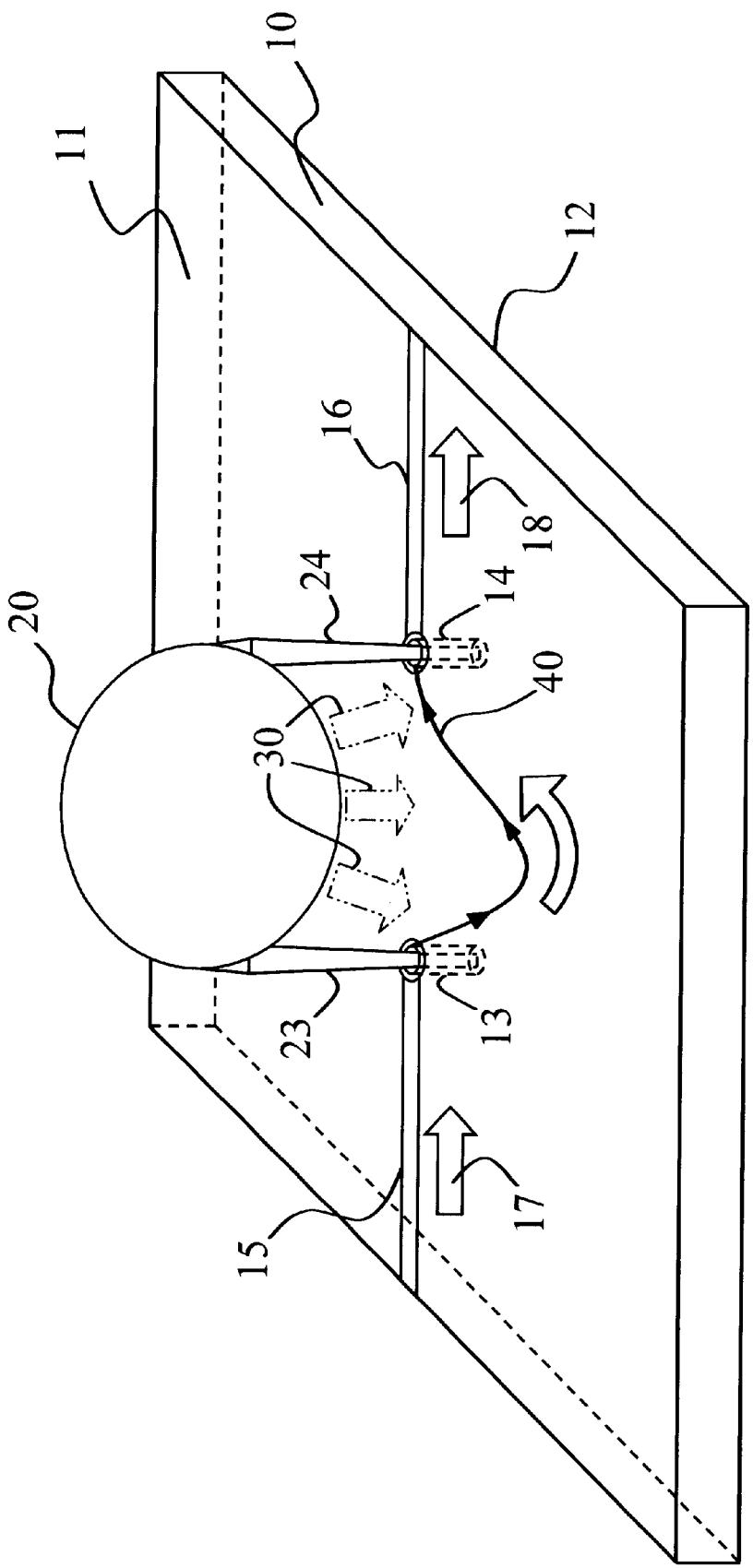

FIGS. 1–3 illustrate the problem that may occur when a component dissipates or radiates heat to the surface of a printed circuit board 10. FIG. 1 shows a through-hole component 20 mounted on a printed circuit board 10. Although one type of through-hole component 20 is shown in FIGS. 1–3, the problem described below would also apply to other types of through-hole components as well as to surface mounted components.

The printed circuit board 10 has a top surface 11 and a bottom surface 12. One thickness of the printed circuit board 10 is about 0.062 inches, but in common practice the printed circuit board may also range from 0.015 to 0.125 inches depending on the specific application of the printed circuit board 10. The present invention, however, is not limited to any specific thickness or range. The through-hole component 20 is mounted to the printed circuit board by mounting legs 23 and 24. The mounting legs 23 and 24 are typically lead wires or pins. The mounting legs 23 and 24 are inserted into holes 13 and 14, respectively, and may be soldered in place. Current flows from the inlet trace 15 of the printed circuit board 10 and up the first leg 23 of the through-hole component 20. The current flows through the through-hole component 20 and down through the second leg 24 of the through-hole component 20. The current then flows out to the outlet trace 16. The direction of the current is shown by arrows 17 and 18 in FIGS. 1–3.

The laminate for printed circuit board 10 is typically produced using phenolic or epoxy resins. Reinforcing materials may include cotton paper, woven glass, mat glass, and glass veil. A popular combination of epoxy-resin and glass reinforcement is referred to as FR-4. Other popular combinations of resins and reinforcement are classified by commonly known notations such as FR-2, CEM-1, CEM-3, FR-5 and GI. Typically, the materials used for printed circuit boards are designed to operate no more than 85° C. to 150° C. The properties of the base material change as the printed circuit board 10 reaches temperatures higher than its design temperature.

FIG. 1 illustrates a through-hole component 20 dissipating or radiating heat 30. A through-hole component 20 may generate heat when the component fails or is subjected to an abnormal condition such as an over-voltage condition which may arise during a lifted neutral failure or other event. A type of through-hole component that may generate heat in such conditions is a Metal Oxide Varistor ("MOV"). MOVs are used in surge suppression applications and may be put directly across a line voltage. MOVs may also generate heat when put across the line voltage in series with a fuse. To obtain necessary ratings when a fuse is used, the fuse must be large enough to handle thousands of amperes of fast pulsed current. As a result, a continuous current exists somewhere between 2.5 amperes and 25 amperes where the fuse will not open. If a MOV is "protected" by such a fuse, lower current continuously flows into the MOV and voltage exists across the MOV. The presence of this current and voltage causes a tremendous amount of energy to be released as heat.

The heat generated by through-hole component 20 conducts down the two mounting legs 23 and 24 to the printed circuit board 10. The heat also dissipates and radiates from the through-hole component 20 to the surface of the printed circuit board 10. This is shown by arrows 30 in FIG. 1. The heat raises the temperature of the printed circuit board 10, causing the printed circuit board's properties to change. If the printed circuit board 10 is allowed to reach a temperature higher than its design temperature, current may begin to flow within the printed circuit board 10. FIG. 2 shows a current path 40 starting to flow through the printed circuit board 10.

Usually (not always) MOVs fail open in which case the current continues to flow in the now low impedance printed circuit board 10. As can be seen between FIGS. 2 and 3, the current path 40 in FIG. 3 has moved as the printed circuit board 10 becomes consumed. As time goes by, the path 40 continues to move to new parts of the printed circuit board 10 until the printed circuit board 10 is entirely consumed. In the case of the through-hole component 20 not totally changing to high impedance, the printed circuit board 10 still becomes lower impedance than the through-hole component 20 at the location of path 40. Path 40 remains low impedance (in the order of a few ohms) due to the current flowing through the path 40 and the impedance of the path 40.

Figure 4:
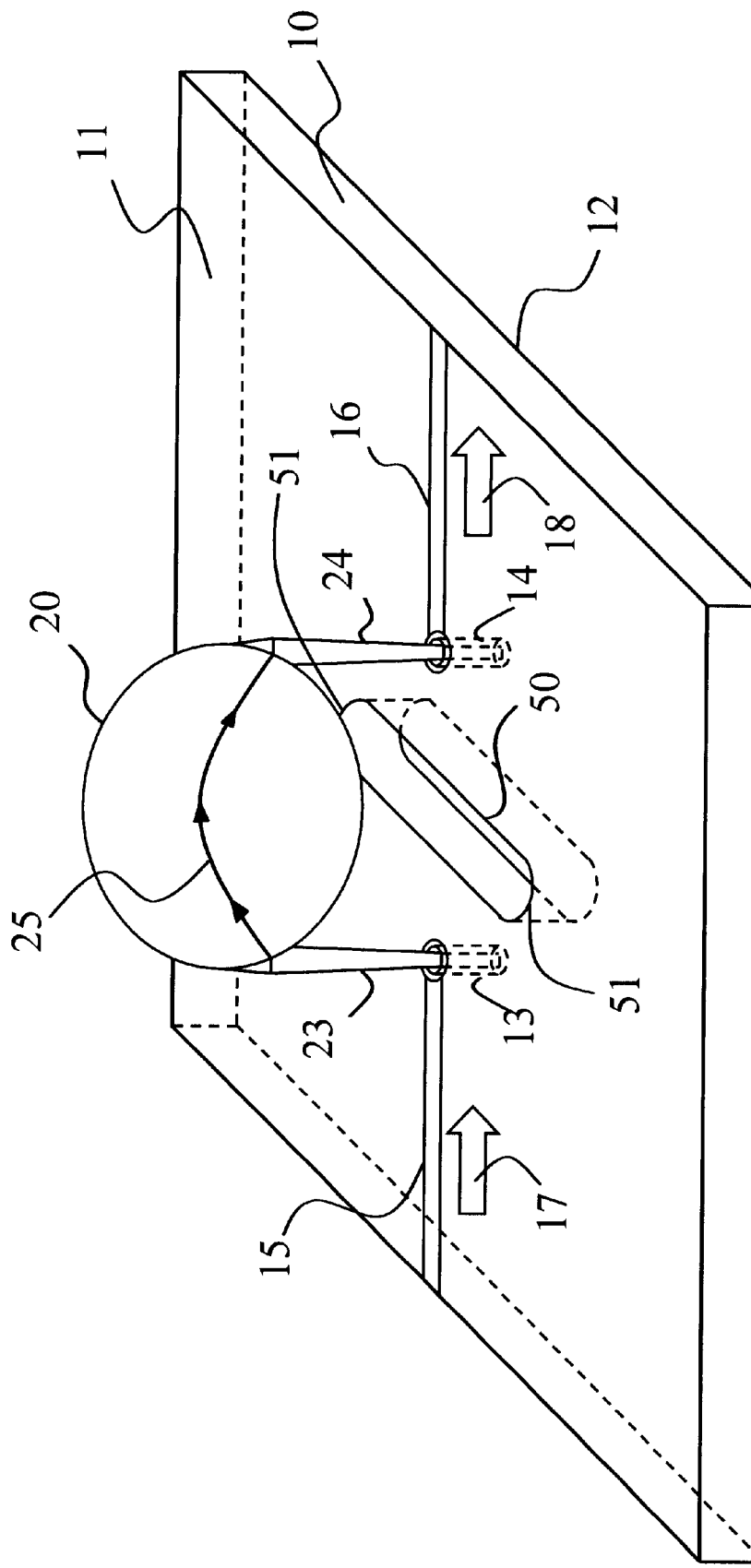
FIG. 4 is a perspective view of an embodiment of the invention, a printed circuit board having a slot positioned between the mounting points of a through-hole component.

FIG. 4 illustrates an embodiment of the invention that provides a solution to the above described problem. In the embodiment shown in FIG. 4, the printed circuit board 10 has a slot 50 located under through-hole component 20 and between holes 13 and 14. It is preferred that the slot 50 extends through the printed circuit board 10 from the top surface 11 to the bottom surface 12. FIG. 4 also shows a particular geometry of the slot 50, with circular ends 51. The slot 50, however, may also be in other geometric shapes such as rectangular or elliptical.

In one embodiment, the slot 50 is a minimum of ¼ inch wide. The length of slot 50 depends on the size of the component. Each end 51 of slot 50 is preferably a minimum of ¼ inch from the nearest surface of the component. Therefore, for a very thin component, the slot is a minimum of ½ inch in length between the ends 51. The slot may be longer for thicker components. For example, if the component is ¼ inch thick, then the length of the slot would be ¾ inch long. The slot 50 does not stop the printed circuit board 10 from changing properties but it does stop current from flowing in the printed circuit board 10 as a result of heat being generated by the through-hole component 20 on the printed circuit board 10.

Figure 5:
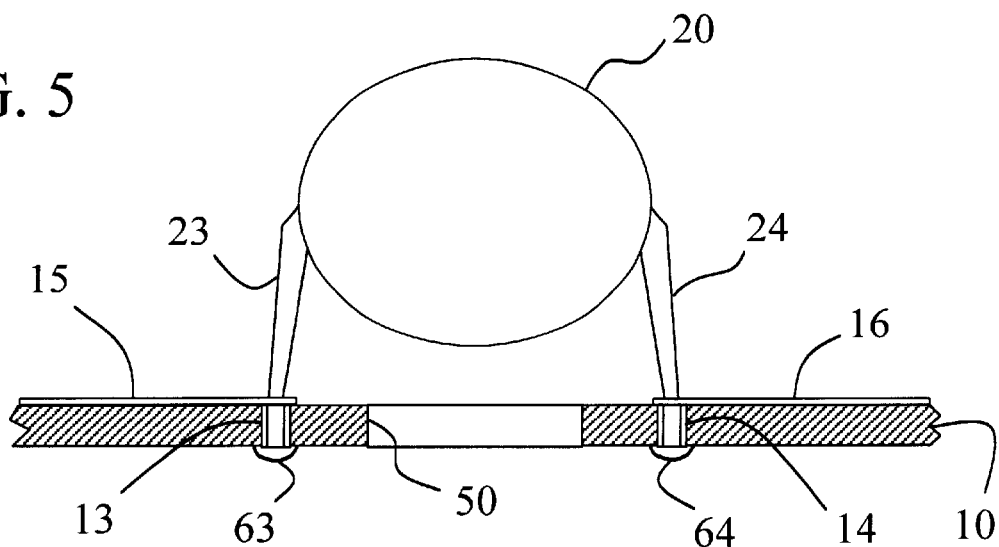
FIGS. 5–7 are sectional views of an embodiment with different types of through-hole components.

FIG. 5 is a sectional view of the printed circuit board 10 shown in FIG. 4. As shown in FIG. 5, the mounting legs 23 and 24 of the through-hole component 20 are inserted into the holes 13 and 14 of the printed circuit board 10. The holes 13 and 14 may be plated through-holes. The mounting legs 23 and 24 of the through-hole component 20 are attached to the printed circuit board 10 by soldering at points 63 and 64.

Figure 6:
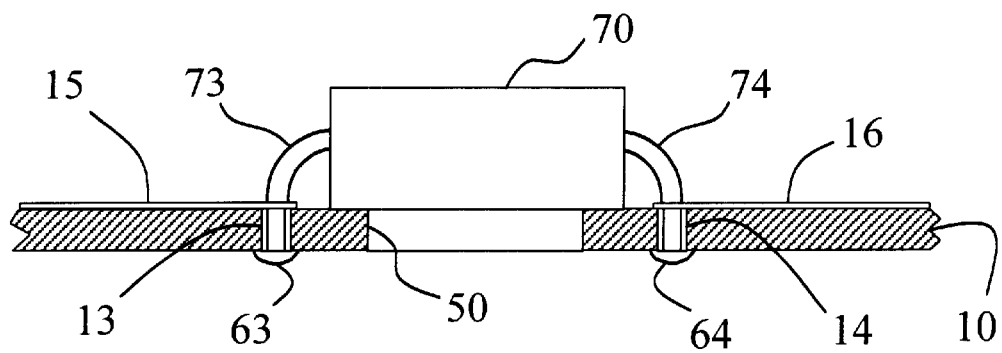
Figure 7:
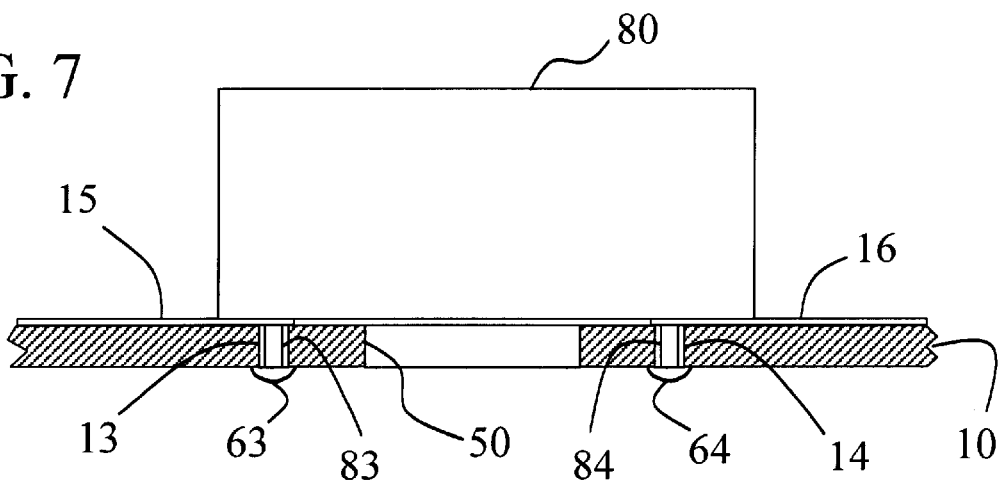

FIGS. 6 and 7 are further illustrations of the embodiment with different types of through-hole components 70 and 80. In FIG. 6, the mounting legs 73 and 74 of another type of through-hole component 70 are bent and inserted into holes 13 and 14 of the printed circuit board 10. The mounting legs 73 and 74 of the through-hole component 70 are preferably attached to the printed circuit board 10 by soldering at points 63 and 64. In FIG. 7, the mounting legs 83 and 84 of another type of through-hole component 80 are inserted into holes 13 and 14 of the printed circuit board 10. The mounting legs 83 and 84 of the through-hole component 80 are preferably attached to the printed circuit board 10 by soldering at points 63 and 64. FIGS. 5, 6 and 7 also illustrate another difference between various types of through-hole components. In particular, a through-hole component may be raised off of the printed circuit board 10 as shown in FIG. 5 or a through-hole component may be mounted right against the printed circuit board 10 as shown in FIGS. 6 and 7. It is preferrable that a through-hole component be raised off of the printed circuit board 10 to further minimize heating of the printed circuit board 10.

Figure 8:
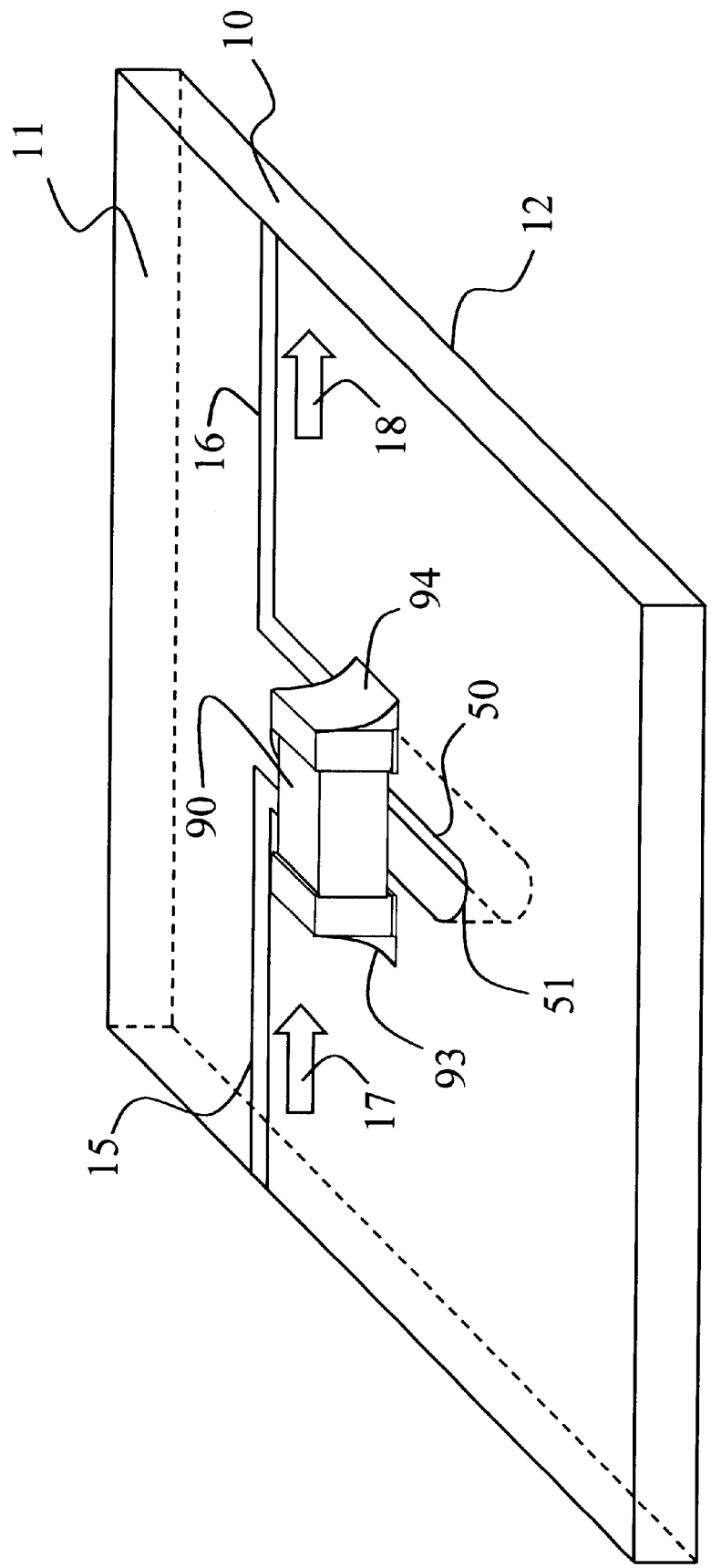
FIG. 8 is a perspective view of another embodiment, a printed circuit board having a slot positioned between the soldered contacts of a surface mounted component.

FIG. 8 is an illustration of an embodiment with a surface mounted component 90. The surface mounted component 90 is preferably attached to the printed circuit board 10 by soldering methods at soldered contacts 93 and 94. There are a variety of soldering methods known to those skilled in the art. The most common production soldering methods, however, are wave soldering or reflow soldering. The printed circuit board 10 has a slot 50 located under surface mounted component 90 and between soldered contacts 93 and 94. It is preferred that slot 50 extend from the top surface 11 to the bottom surface 12 of the printed circuit board 10.

Figure 9:
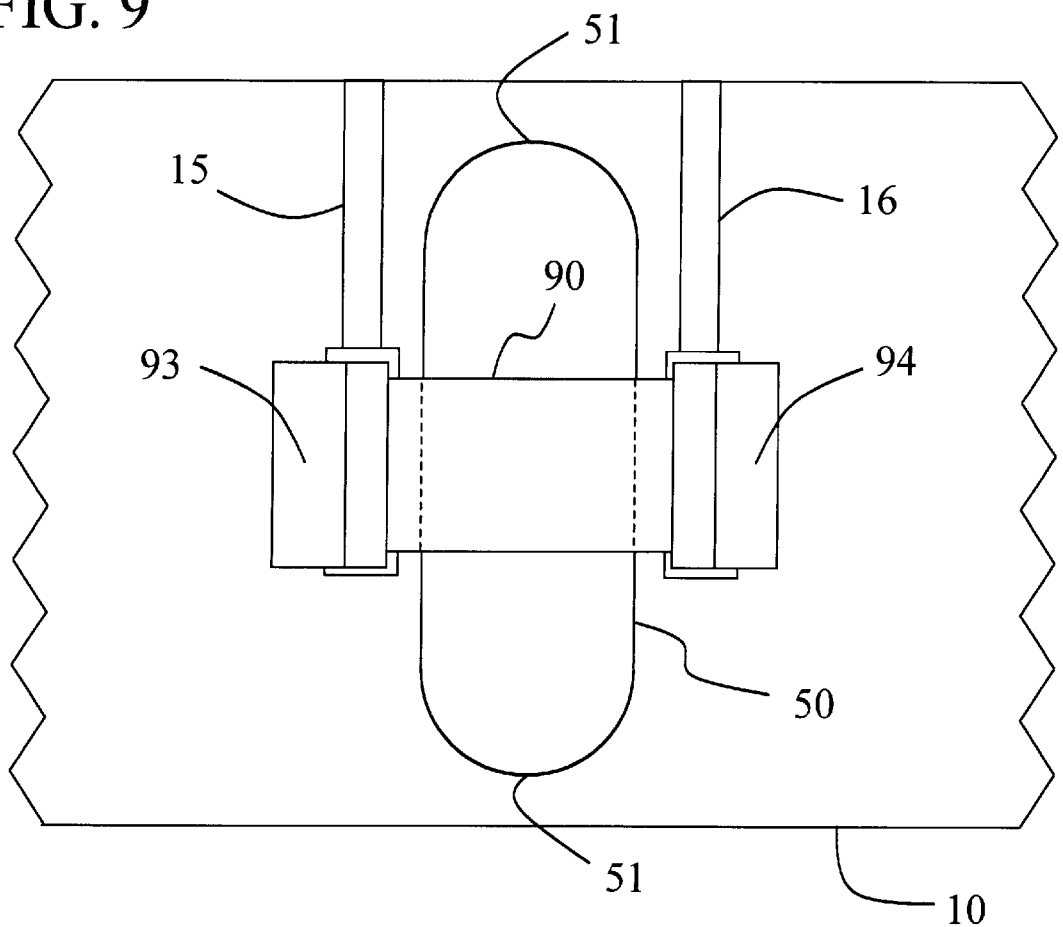
FIG. 9 is a top view of the slot positioned between the soldered contacts of a surface mounted component.
Figure 10:
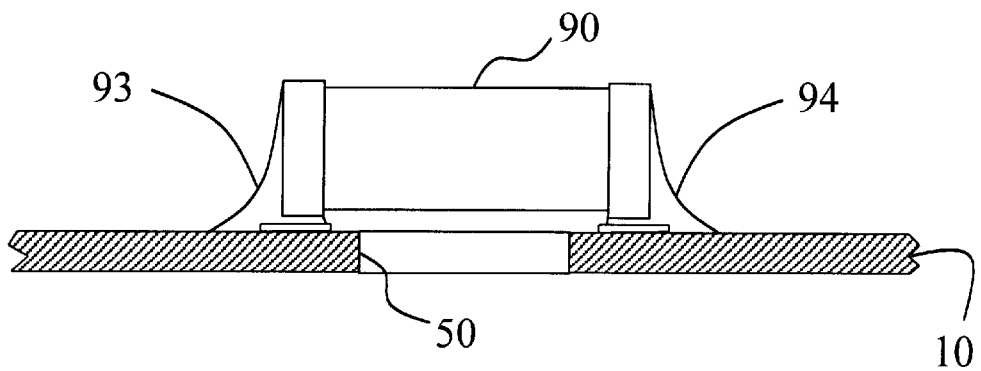
FIG. 10 is a sectional view of the slot positioned between the soldered contacts of a surface mounted component.

FIG. 9 shows a top view of the slot 50 positioned between the soldered contacts 93 and 94. One geometry of slot 50 is illustrated in FIG. 9. The slot 50, however, may also be in other geometric shapes such as rectangular or elliptical. FIG. 10 is a sectional view of the slot 50 positioned between the soldered contacts 93 and 94.

The width and length of slot 50 for a surface mounted component 90 depends on the size of the surface mounted component 90. The width of the slot 50 should be as wide as possible within the constraints of the dimensions of the surface mounted component 90. As for the length, each end 51 of slot 50 is preferably a minimum of ¼ inch from the nearest surface of the surface mounted component 90. Therefore, if the surface mounted component 90 is ¼ inch thick, then the length of the slot 50 (the distance between ends 51) would be ¾ inch long. The slot 50 does not stop the printed circuit board 10 from changing properties but it does stop current from flowing in the printed circuit board 10 as a result of heat being generated by the surface mounted component 90 on the printed circuit board 10.

Another embodiment is a method of preventing current in a printed circuit board 10 by machining and positioning a slot 50 in the printed circuit board 10 between the mounting points of a through-hole component 20, 70 or 80 or a surface mounted component 90. Printed circuit boards 10 are typically formed from a sheet of laminated reinforced resin with an outer surface of copper foil.

The slot 50 is machined before the through-hole component 20, 70 or 80 or the surface mounted component 90 is mounted on the printed circuit board 10. The slot 50 may be cut during the time the contour of the printed circuit board 10 is being routed to design requirements. However, the slot 50 may also be machined before or after the copper foil is etched to form conducting traces 15 and 16. The slot 50 may also be machined before or after the printed circuit board 10 is electroplated. If slot 50 is machined before electroplating, then the slot 50 should be covered to avoid the walls of the slot 50 from being plated.

The slot 50 is preferably machined by using a small rotating cutter, router bit or saw. For small slots, a rotating drill bit may be used to form a slot by drilling a hole and nibbling at the printed circuit board with the drill bit to form the ends of the slot. For larger slots, a slot my be formed by routing out the slot using a routing type bit. This may be done at the same time as the printed circuit board 10 is being routed to design requirements. The slot 50 may also be formed by punching a slot into the printed circuit board 10 using a tool commonly referred to as a punch and die. For a through-hole component 20, 70 or 80, a slot 50 is positioned between the points where the mounting legs are connected to the printed circuit board 10. As shown in FIGS. 4–7, the mounting points for the through-hole component 20, 70 and 80 are holes 13 and 14 of the printed circuit board 10. For a surface mounted component 90, a slot 50 is positioned between the points where the surface mounted component 90 will be soldered or otherwise attached to the printed circuit board 10.

Through-hole components are mounted to the printed circuit boards via mounting legs. As shown in FIG. 4, the mounting legs 23 and 24 of the through-hole component 20 are inserted into holes 13 and 14 of printed circuit board 10. Any excess length of the mounting legs 23 and 24 are cut and the mounting legs 23 and 24 are preferably soldered into place by wave soldering or reflow soldering.

The surface mounted component 90 is preferably mounted to the surface of the printed circuit board 10 by soldering methods such as wave soldering or reflow soldering at soldered contacts 93 and 94.

Although a single-sided printed circuit board is shown in the drawings, it is understood by those of ordinary skill in the art that the single-sided printed circuit board is merely representative of this particular printed circuit board. Printed circuit boards in general may also be double-sided and multi-layered circuit boards. The present invention may be used in double-sided and multi-layered circuit boards.

Thus, there is disclosed in the above description and the drawings, methods and apparatus which fully and effectively accomplish the objects of this invention. However, it will be apparent that variations and modifications of the disclosed embodiments may be made without departing from the principles of the invention or the scope of the appended claims.

What is claimed is:

1. A printed circuit board assembly, which comprises:
    a) a mounting board, said mounting board having a top surface and a bottom surface;
    b) said mounting board having at least two mounting points for receiving an electrical component; and
    c) said mounting board having a slot between said at least two mounting points, said slot extending from the top surface of said mounting board to the bottom surface of said mounting board and having a length greater than a width of said electrical component and a width less than a length of said electrical component, said slot preventing current from passing through said mounting board between each of said at least two mounting points due to a heat-induced change of the properties of the mounting board.

2. The printed circuit board assembly of claim 1, further comprising of an electrical component, said electrical component attached to said at least two mounting points of said mounting board.

3. The printed circuit board assembly of claim 2, wherein said electrical component is a through-hole component.

4. The printed circuit board assembly of claim 2, wherein said electrical component is a surface mounted component.

5. The printed circuit board assembly of claim 2, wherein said electrical component is a Metal Oxide Varistor.

6. The printed circuit board assembly of claim 1, wherein said non-conductive slot is at least 0.25 inch wide.

7. The printed circuit board assembly of claim 1, wherein said non-conductive slot is rectangular in shape.

8. The printed circuit board assembly of claim 1, wherein said non-conductive slot is elliptical in shape.

9. The printed circuit board assembly of claim 1 wherein said slot extends at least 0.25 inches on either side of said mounting component.

10. A printed circuit board assembly, which comprises:
    a) a mounting board, said mounting board having a top surface and a bottom surface;
    b) an electrical component that radiates heat to the top surface of said mounting board;
    c) a means for attaching said electrical component to said mounting board at least two mounting points; and
    d) a means for preventing current from passing through said mounting board between each of said mounting points due to a heat-induced change of the electrical properties of the mounting board.

11. The printed circuit board assembly of claim 10, wherein said electrical component is a Metal Oxide Varistor.

12. The printed circuit board assembly of claim 10, wherein said electrical component is a surface mounted component.

13. The printed circuit board assembly of claim 10, wherein said electrical component is a through-hole component.

14. A printed circuit board comprising:
    at least two mounting points for connecting an electrical component to the circuit board; and
    a slot between the mounting points having a length greater than the width of the electrical component and a width less than the length of the electrical component, the slot preventing current from passing between the mounting points through the printed circuit board due to a heat-induced change of the electrical properties of the printed circuit board.

15. The printed circuit board of claim 14, wherein the electrical component is a through-hole component.

16. The printed circuit board of claim 14, wherein the electrical component is a surface mounted component.

17. The printed circuit board of claim 14, wherein the electrical component is a metal oxide varistor.

18. The printed circuit board of claim 14, wherein the slot is at least 0.25 inch wide.

19. The printed circuit board of claim 14, wherein the slot extends at least 0.25 inch past the electrical component on either side.

20. The printed circuit board of claim 14, wherein the slot is rectangular in shape.

21. The printed circuit board of claim 14 wherein the slot is elliptical in shape.

22. A method of preventing current flow between two mounting points on a printed circuit board due to heating of a printed circuit board, the method comprising providing a slot between the mounting points, the slot having a length greater than a width of an electrical component to be attached to the mounting points and a width less than the length of the electrical component.

23. The method of claim 22 wherein the slot has a width of at least 0.25 inch.

24. The method of claim 22 wherein the slot has a length that extends at least 0.25 inch past the electrical component on either side.

25. The method of claim 22 wherein the slot is rectangular in shape.

26. The method of claim 22 wherein the slot is elliptical in shape.

* * * * *